(12) United States Patent
Antunez et al.

(10) Patent No.: US 10,361,331 B2
(45) Date of Patent: Jul. 23, 2019

(54) PHOTOVOLTAIC STRUCTURES HAVING MULTIPLE ABSORBER LAYERS SEPARATED BY A DIFFUSION BARRIER

(71) Applicant: International Business Machines Corporation, Armonk, NY (US)

(72) Inventors: Priscilla D. Antunez, Tarrytown, NY (US); Arthur W. Ellis, Pleasantville, NY (US); Richard A. Haight, Mahopac, NY (US); James B. Hannon, Lake Lincolndale, NY (US); Satoshi Oida, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 13 days.

(21) Appl. No.: 15/409,142

(22) Filed: Jan. 18, 2017

(65) Prior Publication Data

US 2018/0204970 A1    Jul. 19, 2018

(51) Int. Cl.
*H01L 31/18* (2006.01)
*H01L 31/0725* (2012.01)
(Continued)

(52) U.S. Cl.
CPC ...... *H01L 31/0725* (2013.01); *H01L 31/0326* (2013.01); *H01L 31/0352* (2013.01);
(Continued)

(58) Field of Classification Search
CPC ..... H01L 31/00–078; H01L 31/18–208; Y02E 10/50–60
(Continued)

(56) References Cited

U.S. PATENT DOCUMENTS 4,377,723 A    3/1983 Dalal
4,547,621 A    10/1985 Hack et al.
(Continued)

FOREIGN PATENT DOCUMENTS

CN    102593097 A    7/2012
KR    101335714 B1   5/2013
(Continued)

OTHER PUBLICATIONS

Yuan et al., "Engineering Solar Cell Absorbers by Exploring the Band Alignment and Defect Disparity: The Case of Cu- and Ag-Based Kesterite Compounds," Adv. Funct. Mater., vol. 25, issue 43, pp. 1-11 (Oct. 2015).
(Continued)

*Primary Examiner* — Bach T Dinh
(74) *Attorney, Agent, or Firm* — Vazken Alexanian; Michael J. Chang, LLC

(57) ABSTRACT

Photovoltaic structures having multiple absorber layers separated by a diffusion barrier are provided. In one aspect, a method of forming an absorber on a substrate includes: depositing a first layer of light absorbing material on the substrate; depositing a diffusion barrier; depositing a second layer of light absorbing material on the diffusion barrier, wherein the first layer of light absorbing material has a different band gap from the second layer of light absorbing material; and annealing the absorber, wherein the diffusion barrier prevents diffusion of elements between the first layer of light absorbing material and the second layer of light absorbing material during the annealing. A solar cell and method for formation thereof are also provided.

17 Claims, 7 Drawing Sheets

(51) Int. Cl.
*H01L 31/032* (2006.01)
*H01L 31/0352* (2006.01)

(52) U.S. Cl.
CPC .......... *H01L 31/18* (2013.01); *H01L 31/1864* (2013.01); *Y02E 10/50* (2013.01); *Y02P 70/521* (2015.11)

(58) Field of Classification Search
USPC .................................................. 136/243–265
See application file for complete search history.

(56) References Cited

U.S. PATENT DOCUMENTS

| | | | |
|---|---|---|---|
| 8,927,415 B2 | 1/2015 | Niyogi et al. | |
| 2009/0308437 A1* | 12/2009 | Woods ............ | H01L 31/022425 136/255 |
| 2012/0100663 A1 | 4/2012 | Bojarczuk et al. | |
| 2012/0141799 A1* | 6/2012 | Kub ....................... | B82Y 30/00 428/408 |
| 2012/0285520 A1* | 11/2012 | Bedell .................... | H01L 31/18 136/255 |
| 2012/0318361 A1* | 12/2012 | Teeter ................. | H01L 31/0326 136/264 |
| 2013/0037110 A1 | 2/2013 | Mitzi et al. | |
| 2013/0037111 A1 | 2/2013 | Mitzi et al. | |
| 2014/0150857 A1* | 6/2014 | Yu ........................ | H01L 31/0725 136/255 |
| 2014/0339700 A1 | 11/2014 | Ren et al. | |
| 2015/0075602 A1* | 3/2015 | Ozyilmaz ....... | H01L 31/022466 136/256 |
| 2015/0136216 A1* | 5/2015 | Kurihara ............. | H01L 31/0326 136/256 |
| 2015/0228728 A1* | 8/2015 | Dimitrakopoulos ........................ | H01L 29/1606 257/741 |
| 2015/0299852 A1* | 10/2015 | Ozkan ..................... | H01G 9/20 136/255 |

FOREIGN PATENT DOCUMENTS

| | | |
|---|---|---|
| KR | 101300790 B1 | 8/2013 |
| WO | WO2012050443 A1 | 4/2012 |

OTHER PUBLICATIONS

Ahlberg et al., "Graphene as a diffusion barrier in galinstan-solid metal contacts," IEEE Trans.on Elec. Dev., 61(8), (Jul. 2014) (7 pages).
Ahn et al., "Copper nanowire—graphene core—shell nanostructure for highly stable transparent conducting electrodes", ACS Nano, 9, pp. 3125-3133 (Feb. 2015).
Bouclé, eta al.,"The benefits of graphene for hybrid perovskite solar cells", Synthetic Metals (Dec. 2016) http://dx.doi.org/10.1016/j.synthmet.2016.03.030. (14 pages).
Gloeckler et al.,"Band-gap grading in Cu (In, Ga) Se2 solar cells", J. of Phys. & Chem. of Solids, 66(11), (Nov. 2005). (7 pages).
Hong et al., "Graphene as an atomically thin barrier to Cu diffusion into Si", Nanoscale, 6(13), pp. 7503-7511 (Apr. 2014).
Kim et al.,"Graphene diffusion barrier for forming ohmic contact on N-polar n-type GaN for high-power vertical-geometry light-emitting diodes", App.Phys. Exp., 7(4), 046501-1 to 4 (Mar. 2014).
Kim et al., "Use of graphene for forming Al-based p-type reflectors for near ultraviolet InGaN/AlGaN-based light-emitting diode", Current App. Phys., 14(9), pp. 1176-1180 (Jun. 2014).
Kim et al., "Graphene as a diffusion barrier for Al and Ni/Au contacts on silicon", J. of Vac.Sci. & Tech. B, 30(3), pp. 030602-1 to 030602-4 (Apr. 2012).
Kuhn et al., "Review on the graphene/nanotube application in thin film solar cells", Materials Letters, 171, pp. 323-326 (Feb. 2016).
Liu et al., "The application of highly doped single-layer graphene as the top electrodes of semitransparent organic solar cells", ACS nano, 6(1), 810-818 (Dec. 2011).
Miao et al., "High efficiency graphene solar cells by chemical doping", Nano letters, 12(6), pp. 2745-2750 (Sep. 2012). (14 pages).
Loh et al., "Graphene and Graphene-like Molecules: Prospects in Solar Cells", J. of the ACS, 138(4), pp. 1095-1102 (2016) (published Dec. 2015).
Morrow et al., "Role of graphene interlayers in mitigating degradation of Ni/Au ohmic contact morphology on p-type Ga", Vacuum, 128, pp. 34-38 (Mar. 2016).
Wong et al., "Electronically Transparent Graphene Barriers against Unwanted Doping of Silicon", ACS app. Matl.s & interfaces, 6(22), pp. 20464-20472. (Oct. 2014).
Roy et al., "Graphene as a diffusion barrier for isomorphous systems: Cu—Ni system", Chemical Physics Letters, 646, pp. 158-161 (Jan. 2016).
Li et al., "Cu diffusion barrier: Graphene benchmarked to TaN for ultimate interconnect scaling", IEEE Symp. on VLSI Technology pp. T122-T123 (Jun. 2015).
English Translation of KR101300790B1, Aug. 29, 2013, by Kim et al. (7 pages).
English Translation of CN102593097A, Jul. 18, 2012, by Wei et al. (7 pages).
English Translation of KR101335714B1, May 12, 2013, by Lee et al. (15 pages).

* cited by examiner

US 10,361,331 B2

PHOTOVOLTAIC STRUCTURES HAVING MULTIPLE ABSORBER LAYERS SEPARATED BY A DIFFUSION BARRIER

STATEMENT OF GOVERNMENT RIGHTS

This invention was made with Government support under Contract number DE-EE0006334 awarded by Department of Energy. The Government has certain rights in this invention.

FIELD OF THE INVENTION

The present invention relates to photovoltaic structures and more particularly, to photovoltaic structures involving multiple absorber layers separated by a diffusion barrier.

BACKGROUND OF THE INVENTION

Materials utilized for photovoltaic absorbers have become increasingly complex as those presently available are approaching their efficiency limits. In order to increase the efficiency of multi-elemental photovoltaic absorbers, the material is often graded in composition so that the energy gap (band gap) varies from the front to the back of the absorber in order to drive the electrons and holes more effectively toward their respective electrical contacts, and also to maximize absorption of sunlight.

In many materials, this compositional and/or elemental grading cannot be achieved because rapid diffusion of the elements in the absorber occurs during thermal processing. This problem affects not only photovoltaic devices but is a widespread problem in material science, since high temperature processing diffusively drives elements to undesired places.

Therefore, improved techniques for forming multi-elemental photovoltaic absorbers would be desirable.

SUMMARY OF THE INVENTION

The present invention provides photovoltaic structures having multiple absorber layers separated by a diffusion barrier. In one aspect of the invention, a method of forming an absorber on a substrate is provided. The method includes: depositing a first layer of light absorbing material on the substrate; depositing a diffusion barrier on the first layer of light absorbing material; depositing a second layer of light absorbing material on the diffusion barrier to form a stack of layers of light absorbing materials on the substrate, wherein the first layer of light absorbing material has a different band gap from the second layer of light absorbing material, and wherein the stack of layers of light absorbing materials form the absorber on the substrate; and annealing the absorber, wherein the diffusion barrier prevents diffusion of elements between the first layer of light absorbing material and the second layer of light absorbing material during the annealing.

In another aspect of the invention, a method of forming a solar cell is provided. The method includes: coating a substrate with a layer of a conductive material; forming an absorber on the layer of conductive material by i) depositing a first layer of light absorbing material on the layer of conductive material, ii) depositing a diffusion barrier on the first layer of light absorbing material, iii) depositing a second layer of light absorbing material on the diffusion barrier to form a stack of layers of light absorbing materials on the layer of conductive material, wherein the first layer of light absorbing material has a different band gap from the second layer of light absorbing material, iv) annealing the absorber, wherein the diffusion barrier prevents diffusion of elements between the first layer of light absorbing material and the second layer of light absorbing material during the annealing; forming a buffer layer on the absorber; forming a transparent front contact on the buffer layer; and forming a metal grid on the transparent front contact.

In yet another aspect of the invention, a solar cell is provided. The solar cell includes: a substrate; a layer of a conductive material on the substrate; an absorber on the layer of conductive material, the absorber having: i) a first layer of light absorbing material on the layer of conductive material, ii) a diffusion barrier on the first layer of light absorbing material, iii) a second layer of light absorbing material on the diffusion barrier to form a stack of layers of light absorbing materials on the layer of conductive material, wherein the second layer of light absorbing material has a higher band gap than the first layer of light absorbing material; a buffer layer on the absorber; a transparent front contact on the buffer layer; and a metal grid on the transparent front contact.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques that utilize the interspersing of graphene between layers of materials with different elemental concentrations or different elements in multi-elemental photovoltaic absorbers and other functional materials. In one exemplary embodiment described below, a photovoltaic device is formed by covering a (e.g., molybdenum (Mo)-coated glass) substrate with a layer of a light absorbing material such as CZT(S,Se). This layer of light absorbing material is then covered with one or more layers of a diffusion barrier such as graphene, followed by the deposition of a second layer of light absorbing material having a different elemental concentration (e.g., a different sulfur (S) to selenium (Se) ratio) and/or a different elemental composition (e.g., AZT(S,Se)) than the first, and so on, forming a stack of layers of the light absorbing material.

By way of example only, the light absorbing layers separated by the diffusion barrier may have varying band gaps. The multiple layers with varying band gaps form a "graded band gap" structure that more effectively absorbs light and drives the photo-generated electrons and holes more efficiently to their respective electrical contacts. The diffusion barrier prevents intermixing of the various light absorbing layers during high temperature annealing used to crystallize the film.

Figure 1:
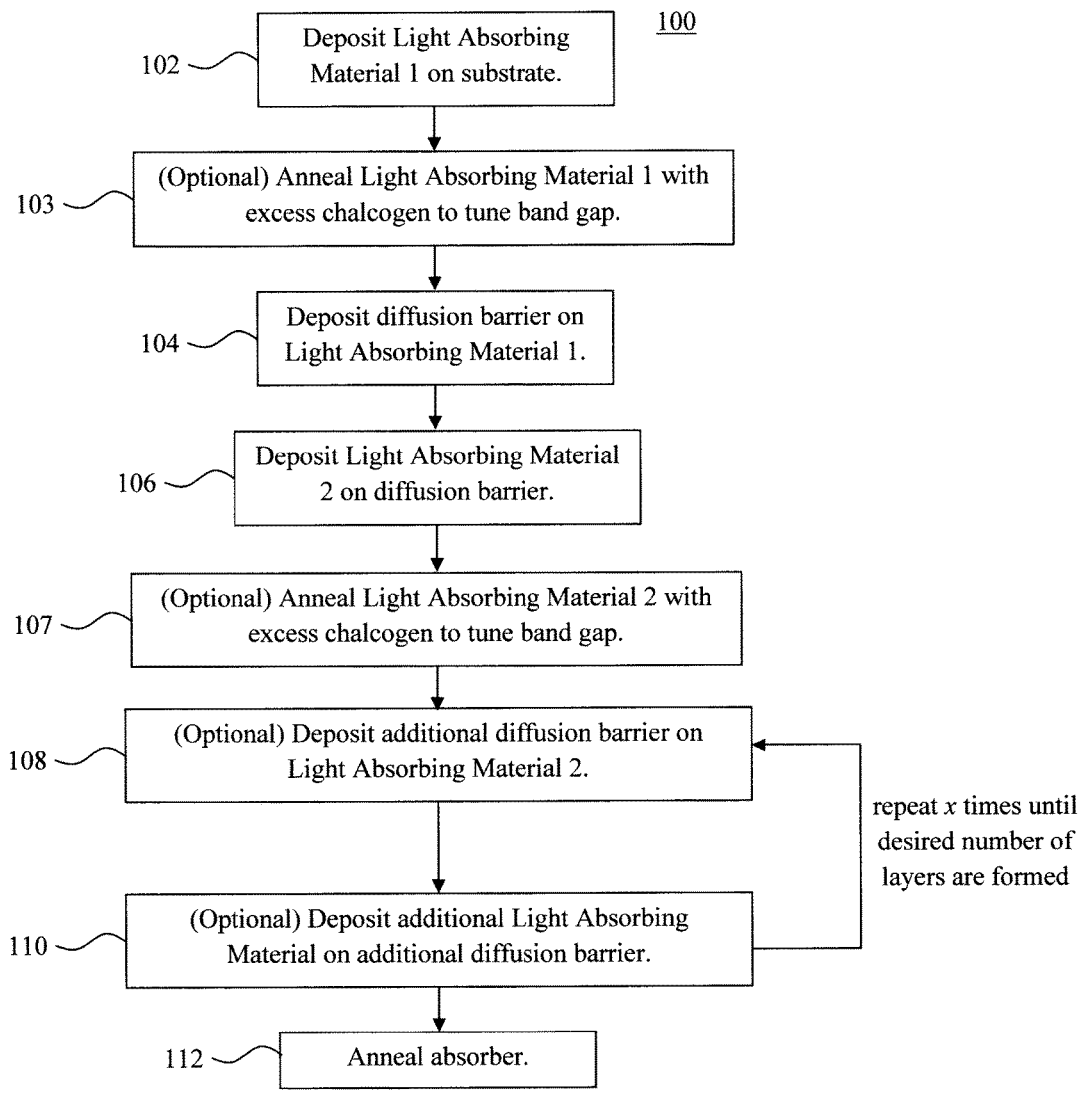
FIG. 1 is a schematic diagram illustrating an exemplary methodology for forming a multi-elemental photovoltaic absorber according to an embodiment of the present invention.

An overview of the present techniques for forming a multi-elemental photovoltaic absorber (or simply "absorber") on a substrate is now provided by way of reference to methodology 100 of FIG. 1. In step 102, a layer of a first light absorbing material (Light Absorbing Material 1) is deposited on the substrate. According to an exemplary embodiment, the present techniques are implemented in the fabrication of a solar cell. Thus, the substrate in that example would be a suitable solar cell substrate (such as soda lime glass (SLG)) coated with a layer(s) of a conductive material (such as Mo). A variety of suitable solar cell substrate and conductive materials are provided below.

According to one exemplary embodiment, the first light absorbing material contains S and/or Se at a given (S:Se) ratio. Suitable light absorbing materials include, but are not limited to CZT(S,Se) and/or AZT(S,Se) materials. As its name implies, CZT(S,Se) includes copper (Cu), zinc (Zn), tin (Sn), and at least one of S and Se. Similarly, AZT(S,Se) includes silver (Ag), Zn, Sn, and at least one of S and Se.

The band gap of CZT(S,Se) and AZT(S,Se) can be varied by varying the S to Se ratio in the material, with an increase in the concentration of S correlating with an increase in the band gap. Thus, according to an exemplary embodiment, the concentration of S is increased in each successive layer of light absorbing material to end up with the light absorbing layer having the greatest concentration of S and greatest band gap at the top of the stack. See below. Thus to use a non-limiting example to illustrate this concept, if each of the light absorbing layers that makes up the absorber is CZT(S,Se), then the S:Se ratio in the layer of the first layer of light absorbing material can be configured (i.e., during formation) to be less than the S:Se ratio in the next highest (i.e., second) layer of light absorbing material (see step 106 described below), and so on. For instance, the first layer of light absorbing material might be configured to contain no S (only Se), while the second layer of light absorbing material will contain a combination of S and Se, or only S (no Se). As a result, the first layer of light absorbing material will have a smaller band gap than the second layer of light absorbing material. The same concept applies to AZT(S,Se) materials.

The band gap of the absorber can also be varied by varying the composition of the light absorbing material. For instance, AZT(S,Se) has a greater band gap than CZTSe, having only Se (no S) (e.g., 1.33 electron volts (eV) for AZT(S,Se) versus 1.0 eV for CZTSe). Thus, to achieve the above-described absorber configuration (i.e., having the light absorbing layer with the greatest band gap at the top of the stack), the layer(s) of the light absorbing material lower in the absorber stack can include CZTSe while the layer(s) of the light absorbing material higher in the absorber stack can include AZT(S,Se).

Combinations of the above-described mechanisms (i.e., varying S:Se ratio and varying absorber material composition) are also contemplated herein. For example, in the lower layers of the absorber stack a CZT(S,Se) light absorbing material can be employed with increasing S concentration moving up the stack, while in the upper layer(s) of the absorber stack a AZT(S,Se) light absorbing material can be employed. This configuration will be described in detail below.

In accordance with the present techniques, the layers of light absorbing materials may be deposited using vacuum-based, solution-based, or other suitable approaches. See for example U.S. Patent Application Publication Number 2012/0061790 filed by Ahmed et al., entitled "Structure and Method of Fabricating a CZTS Photovoltaic Device by Electrodeposition," the contents of which are incorporated by reference as if fully set forth herein. Suitable solution-based Kesterite fabrication techniques are described for example in U.S. Patent Application Publication Number 2013/0037111 filed by Mitzi et al., entitled "Process for Preparation of Elemental Chalcogen Solutions and Method of Employing Said Solutions in Preparation of Kesterite Films," the contents of which are incorporated by reference as if fully set forth herein. A suitable particle-based precursor approach for CZT(S,Se) formation is described for example in U.S. Patent Application Publication Number 2013/0037110, filed by Mitzi et al., entitled "Particle-Based Precursor Formation Method and Photovoltaic Device Thereof," the contents of which are incorporated by reference as if fully set forth herein. Using these processes, the contents of each layer of the light absorbing material can be tuned by controlling the composition during deposition and/or post-deposition during annealing of the deposited film which can be performed in the presence of excess chalcogen—see below.

Co-evaporation of the constituent components from their respective sources may also be employed. See, for example, U.S. patent application Ser. No. 14/936,131 by Gershon et al., entitled "Photovoltaic Device Based on $Ag_2ZnSn(S,Se)_4$ Absorber," the contents of which are incorporated by reference as if fully set forth herein. Valve-controlled sources of S and Se can be implemented to control the S to Se ratio, if so desired. See, for example, U.S. Patent Application Publication Number 2012/0100663 by Bojarczuk et al., entitled "Fabrication of CuZnSn(S,Se) Thin Film Solar Cell with Valve Controlled S and Se," the contents of which are incorporated by reference as if fully set forth herein.

Optionally, after the first layer of light absorbing material has been formed on the substrate, an intermediate anneal may be performed in an environment containing excess chalcogen (e.g., S and/or Se). See step 103. Elements such as S and Se are volatile, and are lost from the film during heating. Thus, providing excess S and/or Se serves to replace these elements. Annealing also improves grain characteristics of the material. Further, as provided above, the ratio of S:Se can be varied throughout the layers of light absorbing material to control the band gap. Performing this intermediate anneal in a chalcogen-containing ambient provides a convenient mechanism to regulate the S and/or Se concentration. For instance, to successively increase the S concentration in each layer deposited on the stack, an intermediate anneal can be performed after the deposition of each layer. The amount of S in the ambient employed during the intermediate anneal can be increased for each layer, thereby increasing the S concentration (and band gap) of each successive layer formed on the stack. The diffusion barrier placed after each layer retains the elements in the present layer by preventing them from diffusing down into lower layers beneath the diffusion barrier. According to an exemplary embodiment, the intermediate anneal is performed at a temperature of from about 400 degrees Celsius (° C.) to about 800° C., and ranges therebetween, for a duration of from about 100 seconds to about 120 seconds, and ranges therebetween. The use of intermediate anneals in a chalcogen environment to tune the band gap are, however, optional such as in the case where the compositions of the various layers of light absorbing materials are tuned during deposition of the material. In that case, a single anneal (see step 112—described below) can be performed after completion of the stack to improve grain characteristics.

Next, in step 104 a diffusion barrier is formed on the first layer of light absorbing material. Suitable diffusion barrier materials include, but are not limited to, graphene, titanium nitride (TiN), tantalum nitride (TaN), and tungsten nitride (WN). According to an exemplary embodiment, the diffusion barrier includes graphene. Graphene is transparent to light and thus is a suitable choice for use in a (light) absorber of a solar cell. For example, at least one layer of graphene is deposited on the first layer of light absorbing material in step 104. Graphene can be transferred from a substrate (on which the graphene has been grown) to the first layer of light absorbing material using, e.g., an exfoliation process. In this example, the diffusion barrier can include a single layer (i.e., one atomic layer of graphene) or multiple layers (i.e., from about 1 layer to about 5 layers of graphene, and ranges therebetween). With these few layers (i.e., about 5 or less) of the graphene, the diffusion barrier will still remain transparent, and in production it may be challenging to apply only a single layer. Graphene is also conducting and will not decompose during high temperature anneal steps required to produce high efficiency CZT(S,Se).

In step 106, a second layer of a light absorbing material (Light Absorbing Material 2) is deposited on top of the diffusion barrier, forming a stack of light absorbing layers on the substrate. This stack of layers collectively serves as an absorber.

In order to achieve band gap grading, the second layer of light absorbing material differs in concentration and/or composition from the first layer of light absorbing material. Namely, as described above, the concentration of sulfur (S) can be increased in the second layer of the light absorbing material as compared to the first layer of light absorbing material, which increases the band gap of the second layer of light absorbing material as compared to the first layer of light absorbing material. Compositionally, the second layer of light absorbing material can be a different (greater band gap) material than the first layer of light absorbing material. For instance, the first layer of light absorbing material can be CZT(S,Se), while the second layer of light absorbing material can be AZT(S,Se). As described above, AZT(S,Se) has a greater band gap than CZTSe.

As above, an intermediate anneal in a chalcogen ambient can again be performed after the second layer of light absorbing material to tune the S:Se ratio in the second layer of light absorbing material. See step 107. Suitable conditions for this intermediate anneal were provided above. To increase the band gap, one could simply increase the amount of S provided during this (subsequent) intermediate anneal to increase the amount of S in the second layer of light absorbing material as compared to the first layer of light absorbing material. The following example illustrates this concept. After deposition of the first layer of light absorbing an intermediate anneal is performed in a first chalcogen containing environment. The idea is to start off the stack with the lowest S-concentration, so the first chalcogen containing environment preferably contains more Se than S, or perhaps no S at all. Following deposition of the barrier layer and the second layer of light absorbing material, another intermediate anneal is performed in a second chalcogen-containing environment having a greater S concentration than the first chalcogen-containing environment. For instance, the second chalcogen-containing environment contains more S than Se, or perhaps no Se at all. That way, the concentration of S (and thus the band gap) increases in the layers moving up the stack. The diffusion barrier (formed in step 104) prevents intermixing of elements between the layers.

The stack can be complete with two layers of light absorbing material or optionally, as shown in FIG. 1, an additional diffusion barrier can be deposited on the second layer of light absorbing material (step 108) and an additional layer of light absorbing material can be deposited on the additional diffusion barrier (step 110). The barrier layers are preferably the same throughout the stack. The additional light absorbing layer is configured to differ in composition and/or concentration to increase the band gap in the same manner as described above. Further, as shown in FIG. 1, steps 108 and 110 can be repeated x times until the desired number of light absorbing layers is present in the stack. Thus, each time a light absorbing layer is deposited it is topped with a diffusion barrier before the next light absorbing layer is placed. By way of example only, multiple iterations of steps 108 and 110 can be performed to place multiple layers of CZT(S,Se) or multiple layers of AZT(S, Se), wherein each layer added to the stack has a higher S concentration than the previous layer, and hence a greater band gap.

Once the desired number of light absorbing layers have been formed in the stack, a final anneal of the absorber is performed in step 112. Annealing serves to improve the grain structure of the film. According to an exemplary embodiment, the anneal is performed at a temperature of from about 400° C. to about 800° C., and ranges therebetween, for a duration of from about 100 seconds to about 120 seconds, and ranges therebetween. Preferably, the annealing is performed in an environment containing excess chalcogen (e.g., S and/or Se) which, as described above, serves to replace these volatile elements lost during heating and/or can be used to tune the band gap. When anneals in a chalcogen environment are used to tune the band gap, then the anneal performed in step 112 serves the same purpose as the intermediate anneals (described above), except that it serves to tune the band gap of the last (top) layer of the stack. Advantageously, the barrier layer(s) prevent inter-diffusion of elements between the layers of light absorbing materials in the stack.

Figure 2:
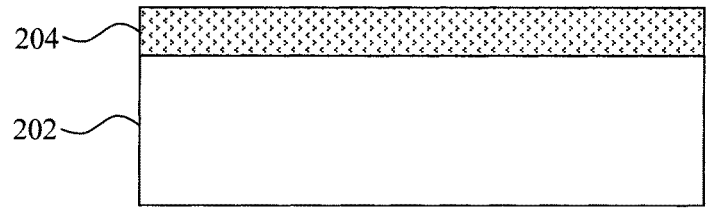
FIG. 2 is a cross-sectional diagram illustrating a substrate coated with a layer of an electrically conductive material according to an embodiment of the present invention.

According to an exemplary embodiment, the present techniques are implemented in the fabrication of a solar cell. This exemplary embodiment is now described by way of reference to FIGS. 2-6. As shown in FIG. 2, the process begins with a substrate 202 coated with a layer 204 (or optionally multiple layers represented generically by layer 204) of an electrically conductive material.

Suitable solar cell substrates 202 include, but are not limited to, glass (e.g., soda lime glass (SLG)), ceramic, metal foil, or plastic substrates. Suitable materials for forming the electrically conductive layer 204 include, but are not limited to, Mo, molybdenum trioxide ($MoO_3$), gold (Au), nickel (Ni), tantalum (Ta), tungsten (W), aluminum (Al), platinum (Pt), titanium nitride (TiN), silicon nitride (SiN), and combinations thereof (such as an alloy of one or more of these metals or as a stack of multiple layers such as $MoO_3$+Au). The electrically conductive layer 204 will serve as a back contact of the solar cell.

According to an exemplary embodiment, the conductive layer 204 forms a coating on the substrate 202 having a thickness of greater than about 0.1 micrometers (μm), for example, from about 0.1 μm to about 2.5 μm, and ranges therebetween. The various layers of the solar cell will be deposited sequentially using a combination of vacuum-based and/or solution-based approaches. For instance, according to an exemplary embodiment, the electrically conductive material 204 can be deposited onto the substrate 202 using a process such as evaporation or sputtering.

Figure 3:
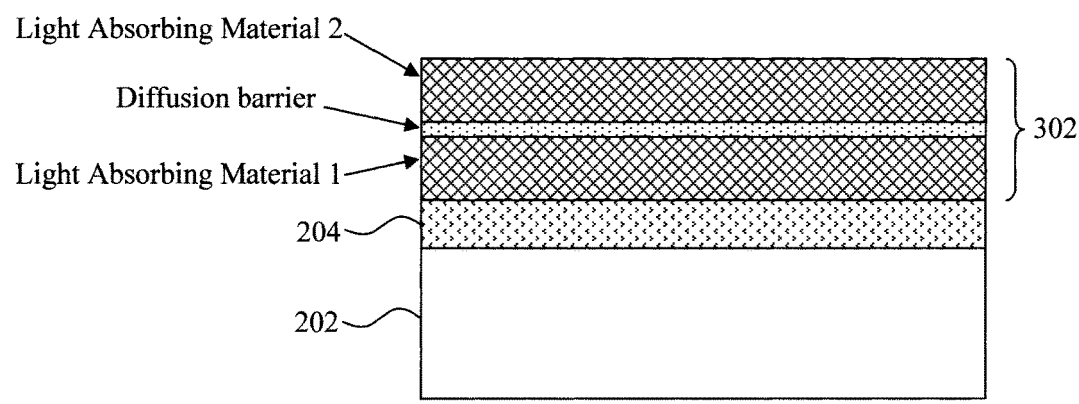
FIG. 3 is a cross-sectional diagram illustrating a multi-elemental absorber having been formed on the electrically conductive material, the multi-elemental absorber having at least two layers of light absorbing materials separated by a diffusion barrier according to an embodiment of the present invention.

As shown in FIG. 3, an absorber 302 is next formed on the conductive layer 204. Absorber 302 is formed using the process described in conjunction with the description of FIG. 1, above. For instance, absorber 302 is shown in this example to include a first layer of a light absorbing material (Light Absorbing Material 1) and a second layer of a light absorbing material (Light Absorbing Material 2) separated by a diffusion barrier. Preferably, the second layer of a light absorbing material has a greater band gap than the first layer of a light absorbing material. As described above, this can be accomplished in a number of different ways. One way is to increase the S concentration in the second layer. Another way is to use a higher band gap material in the second layer, i.e., a CZT(S,Se) bottom layer and AZT(S,Se) top layer. Further, it is notable that while only two layers of light absorbing materials are shown in this example, as provided above, more layers can be added to the stack if so desired. An exemplary absorber stack configuration with more than two light absorbing layers is described below. Suitable diffusion barrier materials were provided above. Here the diffusion barrier is shown as a single layer, but it is to be understood that in practice the diffusion barrier can include multiple layers, such as multiple layers of graphene.

Intermediate anneals after the deposition of individual layers of light absorbing material and/or a final anneal after the final layer of light absorbing material is formed on the stack can be performed to enhance the grain structure of the absorber 302 and/or tune the band gap. As described above, these anneals can be performed in a chalcogen (e.g., S and/or Se) environment. As provided above, suitable annealing conditions include a temperature of from about 400 degrees °C. to about 800° C., and ranges therebetween, for a duration of from about 100 seconds to about 120 seconds, and ranges therebetween.

Figure 4:
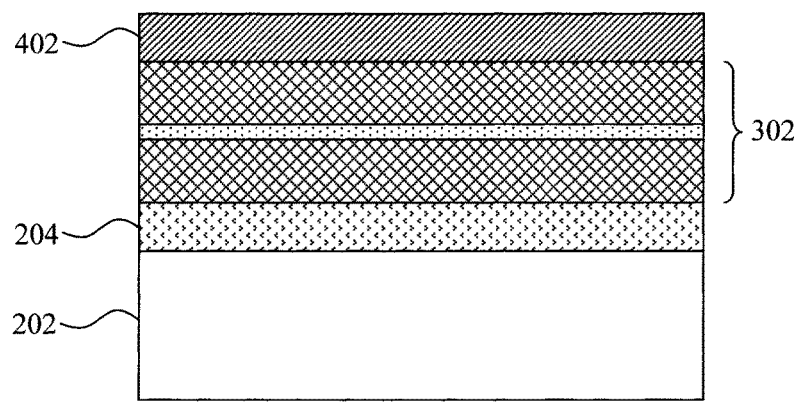
FIG. 4 is a cross-sectional diagram illustrating a buffer layer having been formed on the absorber according to an embodiment of the present invention.
Figure 5:
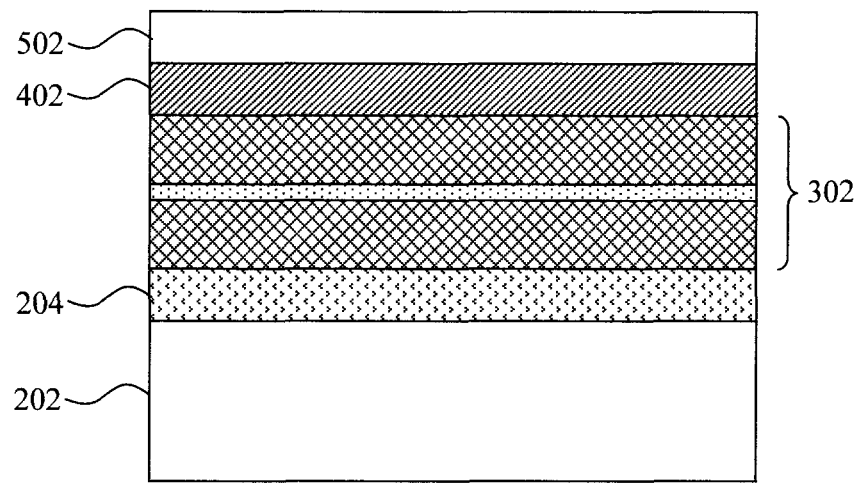
FIG. 5 is a cross-sectional diagram illustrating a transparent front contact having been formed on the buffer layer according to an embodiment of the present invention.

As shown in FIG. 4, a buffer layer 402 is then formed on the absorber 302. The buffer layer 402 forms a p-n junction with the absorber 302. According to an exemplary embodiment, the buffer layer has a thickness of from about 100 angstroms (Å) to about 1,000 Å, and ranges therebetween.

Suitable materials for the buffer layer 402 include, but are not limited to, cadmium sulfide (CdS), a cadmium-zinc-sulfur material of the formula $Cd_{1-x}Zn_xS$ (wherein $0<x\le 1$), indium sulfide ($In_2S_3$), zinc oxide, zinc oxysulfide (e.g., a Zn(O,S) or Zn(O,S,OH) material), and/or aluminum oxide ($Al_2O_3$). According to an exemplary embodiment, the buffer layer 402 is deposited on the absorber 302 using standard chemical bath deposition.

A transparent front contact 502 is then formed on the buffer layer 402. See FIG. 5. Suitable materials for the transparent front contact 502 include, but are not limited to, transparent conductive oxides (TCOs) such as indium-tin-oxide (ITO) and/or aluminum (Al)-doped zinc oxide (ZnO) (AZO). According to an exemplary embodiment, the transparent front contact 502 is formed on the buffer layer 402 by a process such as sputtering.

Figure 6:
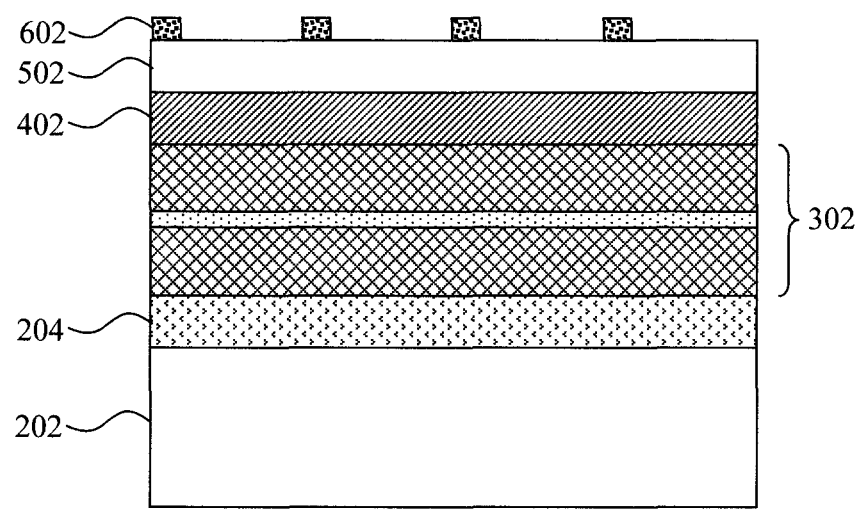
FIG. 6 is a cross-sectional diagram illustrating a metal grid having been formed on the transparent front contact according to an embodiment of the present invention.

As shown in FIG. 6, a metal grid 602 is then formed on the transparent front contact 502. Suitable materials for forming the metal grid 602 include, but are not limited to, nickel (Ni) and/or aluminum (Al). According to an exemplary embodiment, the metal grid 602 is formed on the transparent front contact 502 using a process such as evaporation or sputtering.

A variety of different absorber configurations have been described herein to achieve band gap grading. Some exemplary, non-limiting examples are now provided. In the following examples, the same general solar cell as above is used with variations in the configuration of the absorber. Thus, in the examples, like structures with the above-described solar cell are numbered alike. In each of the examples, the band gap of the light absorbing layers in the absorber stack increases incrementally as one moves up the stack. So, for instance, the band gap of the first layer of light absorbing material in the stack is less than the band gap of the next highest layer of light absorbing material in the stack, and so on. As described above, this band gap grading can be accomplished in a number of different ways. One way is to increase the S concentration in the second layer. Another way is to use a higher band gap material in the second layer, i.e., a CZT(S,Se) bottom layer and AZT(S,Se) top layer. Advantageously, the use of a diffusion barrier between each light absorbing layer prevents inter-diffusion of the elements between the layers in the stack during anneal, thus permitting effective band gap grading to be achieved.

Figure 7:
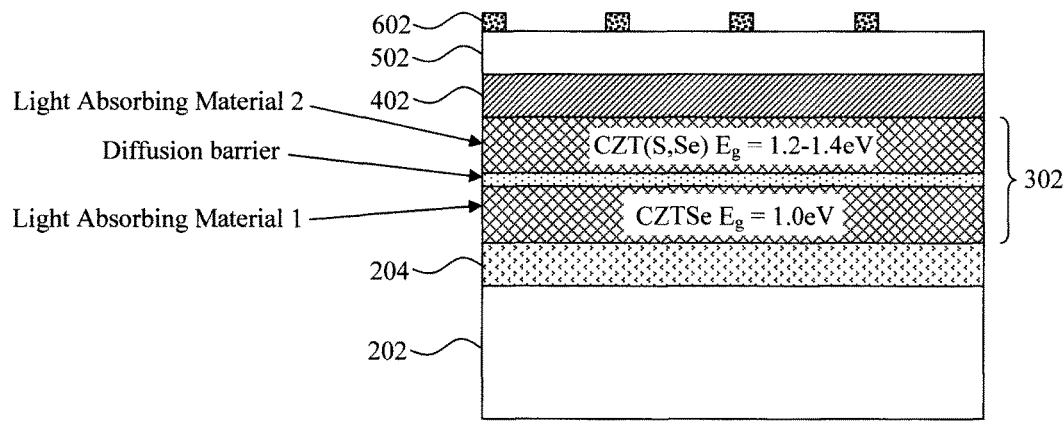
FIG. 7 is a cross-sectional diagram illustrating an exemplary solar cell formed using the present techniques wherein band gap grading is achieved by varying a concentration of sulfur according to an embodiment of the present invention.
Figure 9:
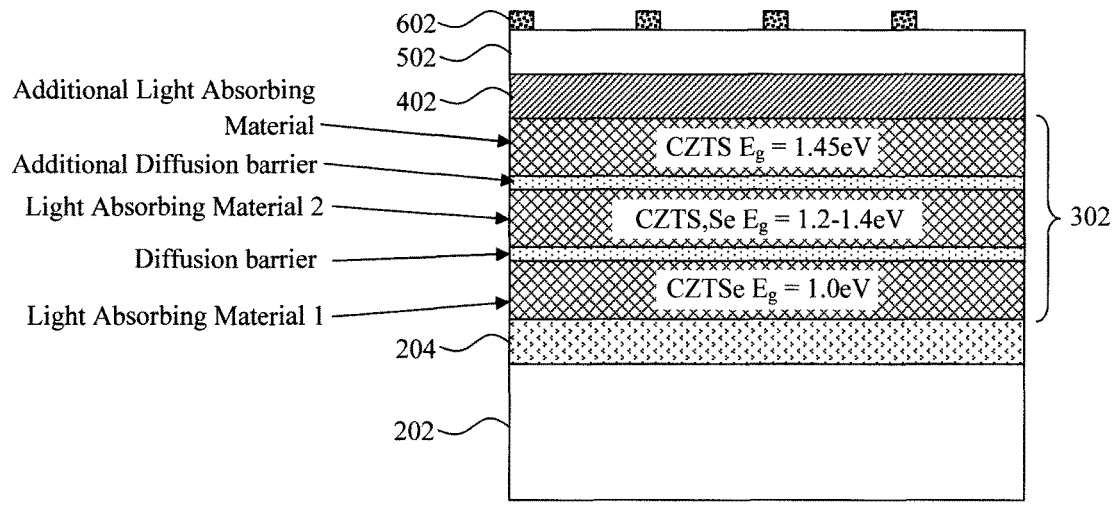
FIG. 9 is a cross-sectional diagram illustrating yet another exemplary solar cell formed using the present techniques wherein at least one additional layer of light absorbing material is included in the absorber stack according to an embodiment of the present invention.

In a first example shown in FIG. 7, the concentration of S is used to tune the band gap of the absorber 302. For instance, the first layer of light absorbing material (Light Absorbing Material 1) will have a lower concentration of S than the second layer of light absorbing material (Light Absorbing Material 2). CZT(S,Se) is used as the light absorbing material in this example. Specifically, in this particular example, the first layer of light absorbing material (Light Absorbing Material 1) contains Se but no S. Accordingly, the abbreviation CZTSe is used to indicate that the first layer of light absorbing material (Light Absorbing Material 1) contains no S. With Se (and no S), the first layer of light absorbing material (Light Absorbing Material 1) will have a band gap ($E_g$) of about 1.0 eV. Adding S increases the band gap. Thus, with a second layer of light absorbing material (Light Absorbing Material 2) containing both S and Se (hence CZT(S,Se)), the band gap of the second layer of light absorbing material (Light Absorbing Material 2) has a higher band gap (than the first layer) of from about 1.2 eV to about 1.4 eV, and ranges therebetween. Alternatively, the second layer of light absorbing material (Light Absorbing Material 2) could instead be configured to contain S but no Se (which is abbreviated herein as CZTS) which would further increase the band gap of the second layer of light absorbing material (Light Absorbing Material 2) to about 1.45 eV. To do so, however, it might be desirable to include an intermediate layer containing both S and Se (i.e., CZT(S,Se)) to achieve a smoother band gap gradient. See, for example, FIG. 9—described below. The same general principle applies to an AZT(S,Se) material. for instance, an AZT(S,Se) light absorbing material can have a band gap ranging from 1.3 eV to 2.01 eV depending on the S concentration, wherein a band gap of 2.01 eV is achievable using S (but no Se), i.e., AZTS. See, for example, Yuan et al., "Engineering Solar Cell Absorbers by Exploring the Band Alignment and Defect Disparity: The Case of Cu- and Ag-Based Kesterite Compounds," Adv. Funct. Mater., vol. 25, issue 43, pgs. 1-11 (October 2015), the contents of which are incorporated by reference as if fully set forth herein.

As highlighted above, another way to consider this S concentration gradient amongst the layers of light absorbing materials is by the S to Se ratio. Generally, the S to Se (S:Se) ratio increases incrementally as one moves up the stack. For instance, in the present example (FIG. 7), the S:Se ratio of the first layer of light absorbing material (Light Absorbing Material 1) is 0 since there is no S in that layer. The S:Se ratio of the second layer of light absorbing material (Light Absorbing Material 2) is between 0 and 1 (e.g., from about 0.5 to about 0.95, and ranges therebetween) due to the inclusion of both S and Se.

Figure 8:
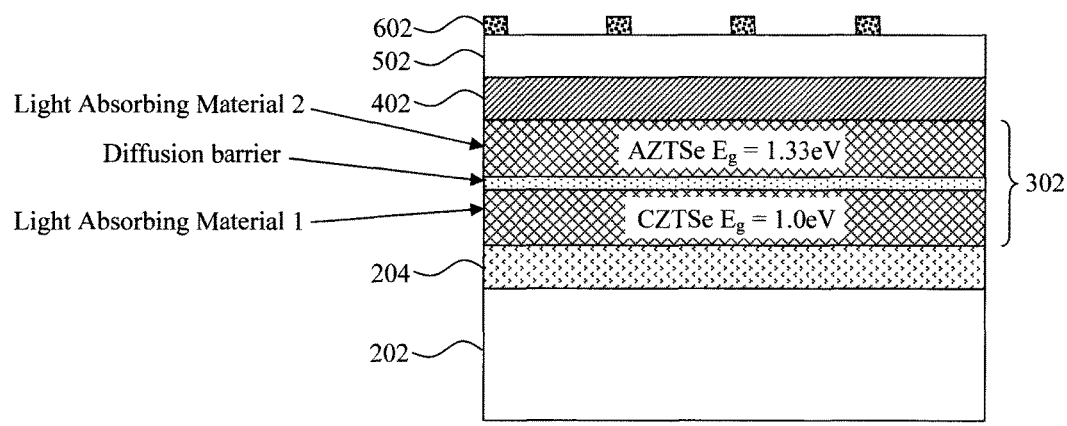
FIG. 8 is a cross-sectional diagram illustrating another exemplary solar cell formed using the present techniques wherein band gap grading is achieved by using different light absorbing materials according to an embodiment of the present invention.

As highlighted above, band gap grading can also be achieved through the use of different light absorbing materials (with different compositions) having different band gaps. See, for example, FIG. 8. As shown in FIG. 8, the first layer of light absorbing material (Light Absorbing Material 1) is CZTSe and the second layer of light absorbing material (Light Absorbing Material 2) is AZTSe. CZTSe has a band gap $E_g$ of about 1.0 eV and AZTSe has a band gap $E_g$ of about 1.33 eV. It is notable that in this example, neither layer contains S. That is however merely an example, and S can be included in the first and/or second layer of light absorbing material (i.e., CZT(S,Se) and/or AZT(S,Se)) if so desired to increase the band gap. As described above, CZT(S,Se) has a band gap $E_g$ of from about 1.2 eV to about 1.4 eV, and ranges therebetween. AZT(S,Se) has a band gap $E_g$ of from about 1.3 eV (e.g., with Se and no S, i.e., AZTSe) to about 2.01 eV (e.g., with S and no Se, i.e., AZTS), and ranges therebetween (depending on the S:Se ratio).

Embodiments having an absorber containing more than two layers of light absorbing materials are also contemplated herein. See, for instance, FIG. 9. In the example shown in FIG. 9, a concentration gradient of S amongst the layers of light absorbing materials is used to create a band gap gradient in the absorber 302. By way of example only, CZT(S,Se) is used as the light absorbing material in this instance. The S concentration is graded by employing a first layer of light absorbing material (Light Absorbing Material 1) having Se and no S (i.e., CZTSe), then a second layer of light absorbing material (Light Absorbing Material 2) having both S and Se (i.e., CZT(S,Se)), thereby increasing the band gap through the inclusion of S. Finally, an additional light absorbing material is added to the stack (Additional Light Absorbing Material) having S and no Se (i.e., CZTS), thereby achieving the highest band gap in the stack (e.g., a band gap $E_g$ of about 1.45 eV).

Another way to characterize this configuration is through reference to the S:Se ratio of the various layers. In the present example (FIG. 9), the first layer of light absorbing material (Light Absorbing Material 1) has an S:Se ratio of 0 (since there is Se and no S). The second layer of light absorbing material (Light Absorbing Material 2) has an S:Se ratio of between 0 and 1 (since there is Se and no S) (e.g., from about 0.5 to about 0.95, and ranges therebetween) due to the inclusion of both S and Se. Finally, the additional layer of light absorbing material (Additional Light Absorbing Material) has an S:Se ratio of 1 (since there is S and no Se).

Figure 10:
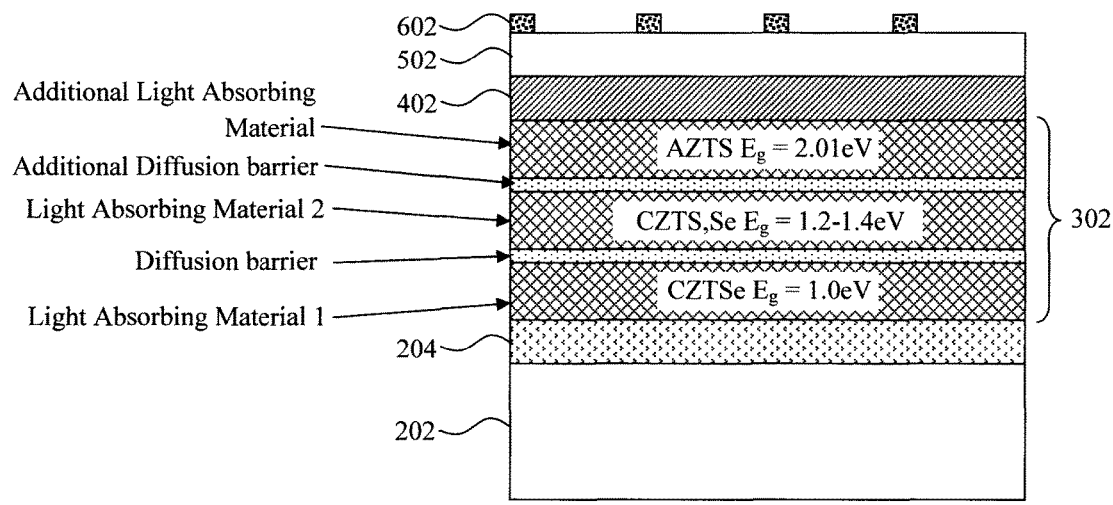
FIG. 10 is a cross-sectional diagram illustrating still yet another exemplary solar cell formed using the present techniques wherein band gap grading is achieved by varying a concentration of sulfur and by using different light absorbing materials according to an embodiment of the present invention.

Both concentration and composition tuning techniques can also be implemented in the same absorber stack to tune the band gap. See, for example, FIG. 10. For instance, building on the configuration presented in FIG. 8 (see above) where a CZTSe bottom layer and an AZTSe top layer are employed, here an intermediate layer of CZT(S,Se) is placed in between the top and bottom layers. As shown in FIG. 10, by including an intermediate layer (with an intermediate band gap value, a more gradual band gap grading (as compared to that shown in FIG. 8) can be achieved. Further, in order to insure a continual increase in band gap up the stack, it may be desirable in this case to employ a high-S concentration AZT(S,Se) as the top layer (such as AZTS with a band gap of 2.01 eV).

Figure 11:
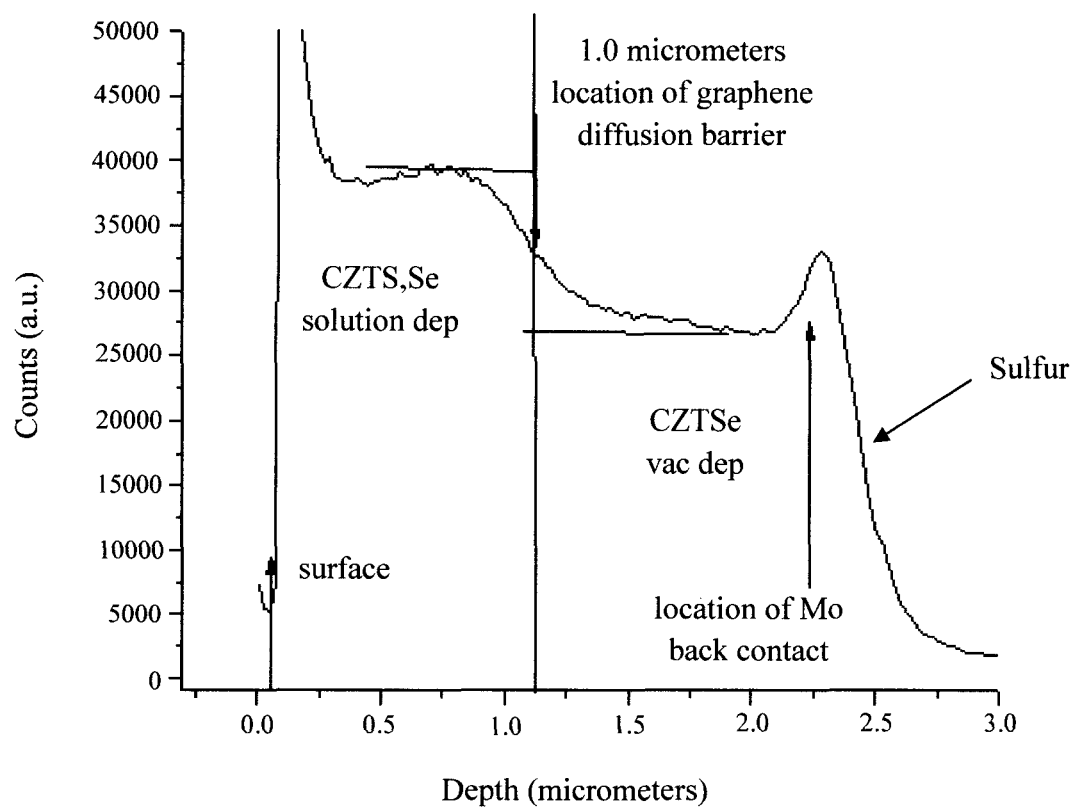
FIG. 11 is a diagram illustrating the effectiveness of graphene as a diffusion barrier in an absorber prepared according to the present techniques according to an embodiment of the present invention.

The above-described diffusion barrier(s) have been found to be an effective barrier against inter-diffusion of elements between the layers of light absorbing materials in the absorber stack. See, for example, FIG. 11. As shown in FIG. 11, during the present process the diffusion barrier (in this case graphene) effectively maintains two separate layers of light absorbing materials (in this case CZTSe and CZT(S,Se))—as in the exemplary configuration of FIG. 7) after annealing. The composition (measured in arbitrary units (a.u.) is shown as a function of the depth in the absorber (i.e., from the conductive layer/back contact (in this case Mo) to the top surface of the absorber).

Figure 12:
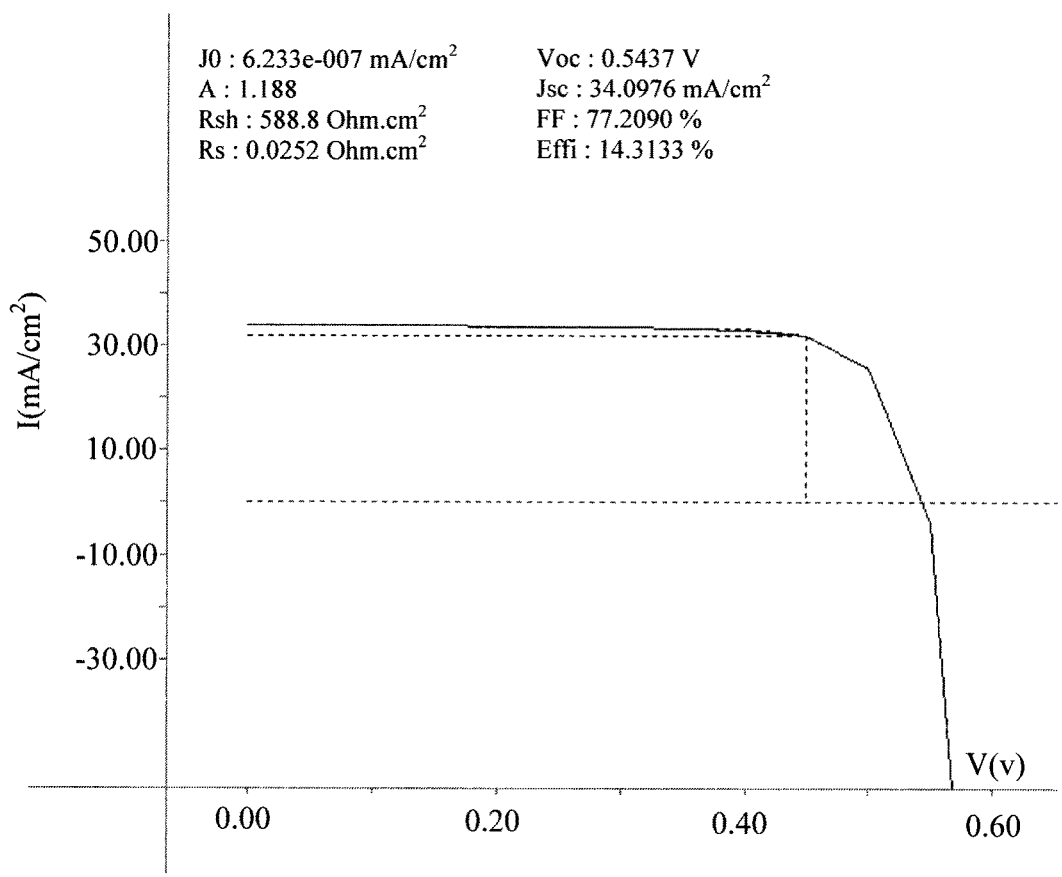
FIG. 12 is a diagram illustrating current-voltage (I/V) characteristics of a solar cell prepared according to the present techniques according to an embodiment of the present invention.

FIG. 12 is a diagram illustrating current-voltage (I/V) characteristics of a solar cell prepared according to the present techniques having the absorber configuration illustrated in FIGS. 7 and 11. As shown in FIG. 12, the solar cell had a saturation current (J0) of 6.233e-007 milliamps per square centimeter ($mA/cm^2$), a shunt resistance (Rsh) of 588.8 Ohms·square centimeter ($Ohm·cm^2$), a series resistance (Rs) of 0.0252 Ohm·cm², an open circuit voltage (Voc) of 0.5437 volts (V), a short circuit current (Jsc) of 34.0976 $mA/cm^2$, a fill factor (FF) of 77.2090 percent, and an efficiency of 14.3133 percent.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming an absorber on a substrate, the method comprising:
    depositing a first layer of light absorbing material on the substrate;
    depositing a diffusion barrier on the first layer of light absorbing material;

depositing a second layer of light absorbing material on the diffusion barrier to form a stack of layers of light absorbing materials on the substrate, wherein the first layer of light absorbing material has a different band gap from the second layer of light absorbing material, and wherein the stack of layers of light absorbing materials form the absorber on the substrate; and annealing the absorber, wherein the diffusion barrier prevents diffusion of elements between the first layer of light absorbing material and the second layer of light absorbing material during the annealing, wherein the method further comprises performing an intermediate anneal of the absorber in a first chalcogen-containing environment after depositing the first layer of light absorbing material but prior to depositing the diffusion barrier, wherein the annealing is performed in a second chalcogen-containing environment, and wherein the second chalcogen-containing environment has a higher sulfur concentration than the first chalcogen-containing environment.

2. The method of claim 1, wherein the second layer of light absorbing material has a higher band gap than the first layer of light absorbing material.

3. The method of claim 1, wherein the diffusion barrier comprises a material selected from the group consisting of: graphene, titanium nitride, tantalum nitride, and tungsten nitride.

4. The method of claim 1, wherein the diffusion barrier comprises graphene, the method further comprising:
depositing the diffusion barrier on the first layer of light absorbing material using exfoliation of the graphene.

5. The method of claim 4, wherein the diffusion barrier comprises from about 1 layer to about 5 layers of graphene.

6. The method of claim 1, wherein the first layer of light absorbing material comprises copper, zinc, tin, and at least one of sulfur and selenium, and wherein the second layer of light absorbing material comprises silver, zinc, tin, and at least one of sulfur and selenium.

7. The method of claim 1, wherein the first layer of light absorbing material comprises copper, zinc, tin, and selenium, and wherein the second layer of light absorbing material comprises copper, zinc, tin, sulfur, and selenium.

8. The method of claim 1, further comprising:
depositing an additional diffusion barrier on the second layer of light absorbing material; and
depositing an additional layer of light absorbing material on the additional diffusion barrier, wherein the additional layer of light absorbing material has a higher band gap than both the first layer of light absorbing material and the second layer of light absorbing material.

9. The method of claim 8, wherein the first layer of light absorbing material comprises copper, zinc, tin, and selenium, wherein the second layer of light absorbing material comprises copper, zinc, tin, sulfur, and selenium, and wherein the additional layer of light absorbing material comprises copper, zinc, tin, and sulfur.

10. The method of claim 8, further comprising:
repeating the depositing the additional diffusion barrier and the depositing the additional layer of light absorbing material x number of times until a desired number of layers have been formed on the stack.

11. A method of forming a solar cell, the method comprising:
coating a substrate with a layer of a conductive material;
forming an absorber on the layer of conductive material by i) depositing a first layer of light absorbing material on the layer of conductive material and performing an intermediate anneal of the absorber in a first chalcogen-containing environment after depositing the first layer of light absorbing material but prior to depositing a diffusion barrier, ii) depositing the diffusion barrier on the first layer of light absorbing material, iii) depositing a second layer of light absorbing material on the diffusion barrier to form a stack of layers of light absorbing materials on the layer of conductive material, wherein the first layer of light absorbing material has a different band gap from the second layer of light absorbing material, iv) annealing the absorber, wherein the diffusion barrier prevents diffusion of elements between the first layer of light absorbing material and the second layer of light absorbing material during the annealing, wherein the annealing is performed in a second chalcogen-containing environment, and wherein the second chalcogen-containing environment has a higher sulfur concentration than the first chalcogen-containing environment;
forming a buffer layer on the absorber;
forming a transparent front contact on the buffer layer; and
forming a metal grid on the transparent front contact.

12. The method of claim 11, wherein the second layer of light absorbing material has a higher band gap than the first layer of light absorbing material.

13. The method of claim 11, wherein the diffusion barrier comprises graphene, the method further comprising:
depositing the diffusion barrier on the first layer of light absorbing material using exfoliation of the graphene.

14. The method of claim 11, wherein the first layer of light absorbing material comprises copper, zinc, tin, and at least one of sulfur and selenium, and wherein the second layer of light absorbing material comprises silver, zinc, tin, and at least one of sulfur and selenium.

15. The method of claim 11, wherein the first layer of light absorbing material comprises copper, zinc, tin, and selenium, and wherein the second layer of light absorbing material comprises copper, zinc, tin, sulfur, and selenium.

16. The method of claim 11, wherein the forming of the absorber further comprises v) depositing an additional diffusion barrier on the second layer of light absorbing material and vi) depositing an additional layer of light absorbing material on the additional diffusion barrier, wherein the additional layer of light absorbing material has a higher band gap than both the first layer of light absorbing material and the second layer of light absorbing material.

17. The method of claim 16, wherein the first layer of light absorbing material comprises copper, zinc, tin, and selenium, wherein the second layer of light absorbing material comprises copper, zinc, tin, sulfur, and selenium, and wherein the additional layer of light absorbing material comprises copper, zinc, tin, and sulfur.

* * * * *